Sept. 15, 1953 W. L. BOND ET AL 2,651,831

SEMICONDUCTOR TRANSLATING DEVICE

Filed July 24, 1950 2 Sheets-Sheet 1

INVENTORS: W. L. BOND
M. SPARKS
G. K. TEAL

BY [signature]

AGENT

INVENTORS: W. L. BOND
M. SPARKS
G. K. TEAL
BY
[signature]
AGENT

Patented Sept. 15, 1953 2,651,831

UNITED STATES PATENT OFFICE 2,651,831

SEMICONDUCTOR TRANSLATING DEVICE

Walter L. Bond, New Providence, and Morgan Sparks and Gordon K. Teal, Summit, N. J., assignors to Bell Telephone Laboratories, Incorporated, New York, N. Y., a corporation of New York Application July 24, 1950, Serial No. 175,584

5 Claims. (Cl. 29—25.3)

This invention relates to electrical elements of semiconductor material, for example germanium and silicon, in the form of compound crystals of which the components are of different crystalline orientations, and to an improved method of producing such crystals having controlled grain boundaries at the surface of junction of their components, otherwise physically continuous across the junction.

A general object of the invention is to provide a method of producing compound crystals of semiconductor material comprising adjoined crystals having crystal lattices of controlled difference in orientation.

Another object of the invention is to provide compound crystals of semiconductor material including components of different crystalline orientations physically united at a boundary surface.

It is found that in compound crystals so produced of high purity semiconductor material of n-type conductivity, crystal lattice defects at the boundary surface confer p-type conductivity on the material immediately adjacent the boundary and thereby constitute an n-p-n junction, coextensive with the boundary.

Thus another object of the invention is to provide an extended n-p-n junction in semiconductor material.

Semiconductor bodies having therein an n-p-n junction find application in a variety of signal translating devices, for example in amplifiers one type of which is disclosed in the application Serial No. 35,423, filed June 26, 1948, now Patent 2,569,347, granted September 25, 1951, of W. Shockley. Further, as disclosed in the application Serial No. 98,008, filed June 9, 1949, of R. J. Kircher, in certain such devices an n-p-n junction in the semiconductor body leads to advantageous operating characteristics, notably improved stability and low positive feedback impedance. Semiconductor bodies in accordance with this invention, it has been found, are particularly useful in amplifying devices of the type disclosed in the latter application.

Another object of the invention is thus to provide a method of producing transistor units of low base and feedback resistance.

In the method to be described, two seed crystals of semiconductor material, germanium being selected for illustration, are obtained, each of n-type electrical conductivity, and machined to have crystal lattices differing some ten degrees in orientation with respect to one or another of three rectangular axes perpendicular respectively to the crystal planes (111), (211) and (110). The seed crystals are then clamped together over a common surface perpendicular to or including the chosen axis to form a duplex seed. The exact angle of orientation may vary some, the requirement being that enough defects be present to give a p-type layer at the boundary. The number of acceptor centers necessary will depend on the purity of the material used.

A melt of high purity n-type germanium is then prepared and the joined seed crystals used to draw from it a germanium rod of desired length and girth. In this operation, the crystal boundary between the seeds is propagated lengthwise of the rod as it is drawn, producing a rod comprising two adjoined crystals individually of the same crystalline orientation and conductivity type as the seeds and physically continuous across a longitudinal crystal boundary. As already mentioned, it is found that lattice defects at the junction surface between the components of the drawn rod result in a very thin sheet of p-type material in the immediate vicinity of the surface so that the rod constitutes an elongated n-p-n junction which may be sectioned transversely of its length to furnish a number of discs each containing a p-type sheet, normal to the line of section, between two n-type regions.

Another object of the invention, therefore, is to provide an extended longitudinal n-p-n unit from which a plurality of elements each including such junction and of convenient shape may be cut.

A method which provides transverse p-n or n-p-n junctions in a single rod crystal of semiconductor material is disclosed in the application of M. Sparks and G. K. Teal, filed June 15, 1950, Serial No. 168,181, Production of Single Crystals of Germanium.

The present invention makes use in one embodiment of the apparatus and method disclosed and claimed by J. B. Little and G. K. Teal in their application Serial No. 138,354, filed January 13, 1950, for drawing single germanium crystals in rod form from a mass of molten germanium.

That application discloses and claims the production of grain boundaries by the use of joined seeds of different crystalline orientations. However, when seeds are oriented at random with respect to each other, the boundary produced in the composite drawn crystal does not consistently yield a p-type electrical characteristic. By the method disclosed herein, one is able to find an angle of orientation about one or another lattice plane which produces reproducible crystal boundaries with n-p-n characteristics.

It is thought that atomic lattice defects in the crystal lattice which occur at the boundary act as acceptors and thus tend to produce p-type conductivity. The number of such acceptor centers necessary to overcome the donors present throughout the semiconductor and thus produce the desired thin p-type sheet will thus depend on the donor concentration in the germanium melt. It has been determined that for high back voltage germanium of about 5–10 ohm/cm. resistivity, a mismatch of ten degrees is suitable. A further advantage of using seeds X-ray oriented is that the composite crystal may be grown in approximately the crystal plane which propagates itself most easily. In germanium this is the (111) plane, the plane of greatest atomic density. It is accordingly arranged so to machine the seed crystals that their (111) planes are approximately normal to the direction of drawing.

Another object of the invention is, therefore, to provide a method of drawing composite crystals of geranium in the form of rods including a crystal boundary extending lengthwise of the rod substantially at right angles to the crystalline plane of greatest atomic density.

The invention will be fully understood from the following description, with accompanying drawings in which.

While the following description specifically relates to germanium it will be understood that silicon may be employed in the same way to produce a similar result.

Figures 1, 2, 3, 4:
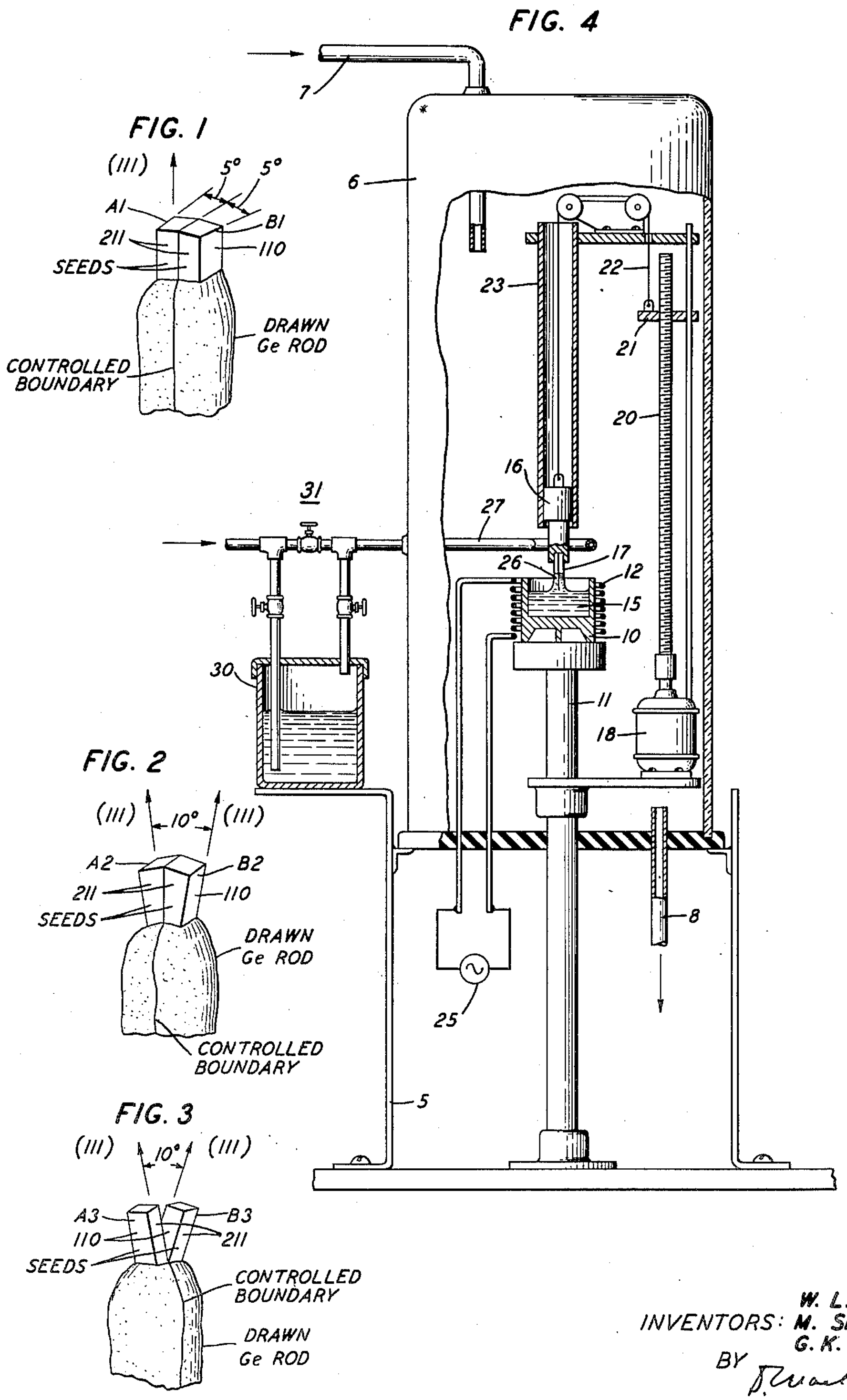
Figs. 1, 2 and 3 show seeds of juxtaposed crystals of like conductivity mismatched with relation to the three mutually rectangular axes, respectively.
Fig. 4 shows, mainly in diametral vertical section, an apparatus suitable for drawing rods of semiconductor material from a melt of the like material.

Referring now to Fig. 1, two seed crystals $A_1$ and $B_1$ of n-type germanium are schematically shown juxtaposed (by a clamp not shown) after being separately machined to provide at the common surface an approximately ten-degree crystalline mismatch about an axis, in this case vertical and normal to the (111) plane. Part of a drawn rod of germanium is shown attached to the seeds, constituting a compound crystal having a boundary continuous with the surface of contact of the seed crystals. The machining is done in accordance with X-ray analyses of crystalline structure of the seeds.

Fig. 2 is a like schematic showing wherein the seed crystals $A_2$, $B_2$ are mismatched ten degrees about an axis normal to the (211) plane, while Fig. 3 similarly represents two seed crystals $A_3$, $B_3$ equally mismatched about an axis normal to the (110) plane, and in each a part of the compound crystal drawn by the seeds. In each of Figs. 1, 2 and 3, the arrows indicate the normals to the (111) planes of of the two seeds, these normals being similarly directed in Fig. 1.

As before stated, the crystal boundary in each case is a sheet of p-type conductivity intervening between two n-type regions, lengthwise of the drawn germanium rod. The component crystals of the rod are physically continuous across the boundary.

Fig. 4 shows in vertical section the essential features of the apparatus employed to draw the rods shown, in part, in Figs. 1, 2 and 3.

Two seeds 17 of n-type germanium, each of which may have been part of a single rod crystal drawn as is to be the compound crystal, and understood to have been machined for mismatched juxtaposition as earlier described, are clamped together, with their (111) planes approximately aligned.

Stand 5 supports bell jar 6 through which hydrogen is passed, entering at inlet 7 and emerging at outlet 8. Graphite crucible 10 surmounting post 11, contains a mass 15 of high purity n-type germanium prepared, say, by the method disclosed and claimed in the application of J. H. Scaff and H. C. Theuerer, "Preparation of Germanium Rectifier Material," filed October 27, 1948, Serial No. 56,742, now Patent 2,576,267, granted November 27, 1951. Seeds 17 are suitably fastened, with their surface of contact vertical, in the lower end of weight 16, which moves upward when motor 18 is started. Motor 18 turns threaded shaft 20 operating unit 21 and so wire 22 to raise weight 16 along the axis of tube 23. After the apparatus has been flushed of air, hydrogen is caused to flow through jar 6 at the rate of about 100 cubic feet per hour. The germanium mass 15 is melted by a high frequency current from source 25, through water-cooled coil 12 which heats by induction crucible 10. The molten germanium is maintained at a temperature slightly above its melting point.

Motor 18 is operated to lower seeds 17 into the molten mass 15, to a depth of a millimeter or so; the seeds are left immersed in the germanium melt long enough for the establishment of temperature equilibrium. In this period a portion of the seeds is melted to relieve strains, and the molten mass is lifted by surface tension to embrace and adhere to the solid portions of the seeds. Motor 18 is then operated to raise seeds 17 and the molten material adherent thereto at a rate substantially equal to the rate of solidification of the adherent germanium, which consequently takes the form of a column 26 in which boundary 36 appears as a prolongation of the surface of contact of the seed crystals.

As column 26 is lifted, cooling jets of hydrogen from a tank not shown are played on its surface through orifices in ring 27. The hydrogen may be taken directly from the tank or through water in jar 30, according as valves 31 are manipulated. Size of column 26 may be varied by varying the rate of flow of the cooling hydrogen.

Figure 5:
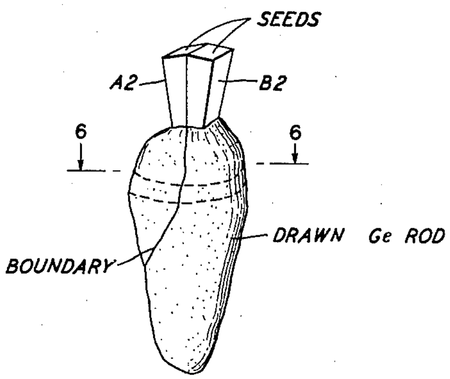
Fig. 5 illustrates a rod drawn by the apparatus of Fig. 4 using the duplex seed of Fig. 2.

Fig. 5 illustrates the appearance of a germanium rod with boundary roughly lengthwise of the rod drawn by seeds $A_2$, $B_2$ of Fig. 2. In this illustration, the boundary has grown out at one side of the rod due to mechanical or thermal instability incurred in the drawing operation.

Figure 6:
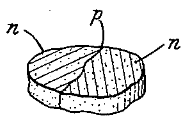
Fig. 6 illustrates a section cut from the rod of Fig. 5 at the plane 6—6 thereof.

Fig. 6 illustrates a slice of the rod of Fig. 5 cut therefrom at the level 6—6. It is found on examination to constitute an n-p-n junction, the crystal boundary being the locus of a sheet of p-type germanium while the outer portions of the disc are n-type slices of the two crystals, descendants of crystals $A_2$ and $B_2$ but physically continuous with each other. The grain boundary is an active n-p-n junction and slices such as that of Fig. 6 are useful as transistors with low base resistance.

It is found that for best results in the direction of growth, that is, vertical in the apparatus of Fig. 4, the crystal plane of juxtaposition of the two seeds is preferably the (110) plane, that being the simplest plane parallel to the "vector (111)"; by the last expression is meant the normal to the (111) plane. Such is the choice of Fig. 1, exactly, and approximately in Figs. 2 and 3.

A slice such as that of Fig. 6 is etched, washed and provided with contacts soldered or electroplated on each side of the boundary. An n-p-n junction comprises a pair of opposed rectifying barriers, so that a current-voltage curve for such a slice should have approximately the same form whichever the direction of current flow across the boundary.

Figure 7:
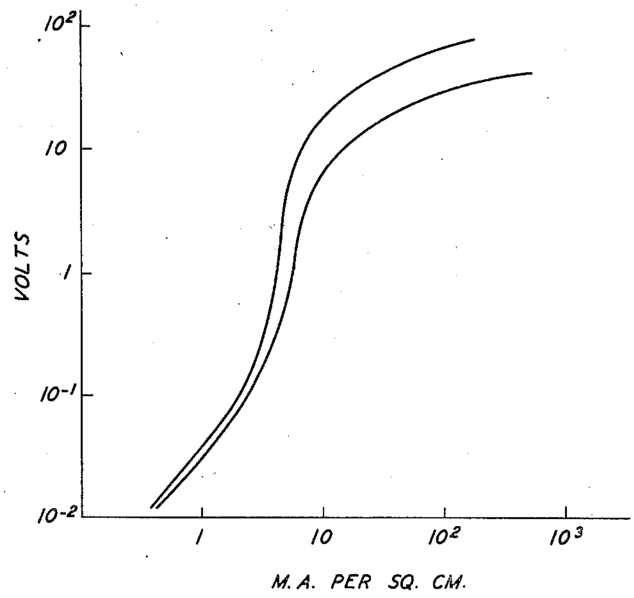
Fig. 7 is a graph of the current-voltage relationship across the grain boundary identified in Fig. 6.

That such is the case is shown by the curves of Fig. 7, obtained with the slice of Fig. 6. The curves are almost coincident. All the electrical properties are extremely sensitive to surface conditions and may be changed advantageously by etching.

Reference is made to the application Serial No. 301,128, filed July 26, 1952, a division of the present application.

What is claimed is:

1. The method of preparing a rod of semiconductor material composed of two elongated crystals of n-type electrical conductivity with a longitudinally intervening sheet of p-type conductivity, which comprises melting a mass of semiconductor material having n-type electrical conductivity, maintaining the mass at a temperature above the melting point, partly immersing in the melt a pair of adjoined elongated seed single crystals of the material having along their junction a difference of the order of ten degrees in crystalline orientation, and lifting the seeds from the melt at a rate substantially equal to the rate of solidification of the uplifted material adherent to the seeds.

2. The method as in claim 1 wherein the seed crystals are adjoined over their (110) planes and the orientation difference is about an axis parallel thereto.

3. The method of preparing a rod of semiconductor material comprising a pair of elongated single crystals of the material of n-type electrical conductivity, physically continuous across a longitudinally intervening sheet of p-type conductivity, which comprises preparing two seed crystals of the material of n-type conductivity, machining the seed crystals to produce on each a surface making a dihedral angle of the order of five degrees with a chosen crystalline plane of the seeds, joining the seeds to include between the chosen planes thereof twice said angle, machining the joined seeds to a common plane at one end and normal to the junction of the seeds, preparing a melt of the material of n-type conductivity, partly immersing the seeds at the common plane in the melt and lifting the seeds from the melt at a rate substantially equal to the rate of solidification of the uplifted material adherent to the seeds.

4. The method as in claim 3 wherein the (110) planes of the seed crystals are approximately parallel to the direction of drawing.

5. The method as in claim 4 wherein the difference in crystalline orientation of the seed crystals is about an axis normal to the (110) planes of the seed crystal.

WALTER L. BOND.
MORGAN SPARKS.
GORDON K. TEAL.

References Cited in the file of this patent

UNITED STATES PATENTS

| Number | Name | Date |
|---|---|---|
| 750,253 | Byrnes | Jan. 26, 1904 |
| 1,541,596 | Skoupy et al. | June 9, 1925 |
| 1,868,099 | Eldred | July 19, 1932 |
| 2,048,733 | Eldred | July 28, 1936 |